United States Patent [19]

Eidschun

[11] 4,372,825
[45] Feb. 8, 1983

[54] PLATING SPARGER AND METHOD

[75] Inventor: Charles D. Eidschun, Clearwater, Fla.

[73] Assignee: Micro-Plate, Inc., Clearwater, Fla.

[21] Appl. No.: 318,953

[22] Filed: Nov. 6, 1981

[51] Int. Cl.³ .................. C25D 5/08; C25D 21/10
[52] U.S. Cl. ............................ 204/27; 204/273; 204/275
[58] Field of Search ............... 204/22, 27, 273, 275, 204/198, 202, 203

[56] References Cited

U.S. PATENT DOCUMENTS

| | | | |
|---|---|---|---|
| 1,431,022 | 10/1922 | Mumford | 204/273 |
| 3,503,856 | 3/1970 | Blackmore | 204/273 |
| 3,933,615 | 1/1976 | Levenson | 204/275 |
| 4,029,564 | 6/1977 | Higuchi | 204/275 |
| 4,174,261 | 11/1979 | Pellegrino | 204/273 |

*Primary Examiner*—T. Tufariello
*Attorney, Agent, or Firm*—Jack E. Dominik

[57] ABSTRACT

Disclosed is a sparger in which there are a plurality of nozzles extending from a vertical sparger pipe, and alternating the vertical sparger pipes or sparger tubes have the nozzles at mid-stations between the adjacent sparger nozzles; with the entire sparger being directed to discharge the fluid to impinge upon the workpiece such as a printed circuit board at an acute angle preferably less than 90°. The resulting pattern on the workpiece is a plurality of footprints, all overlapping a minimum amount on the target area. A further aspect of the invention is directed to having the spargers on one side of the workpiece direct fluid in a downstream direction, whereas the spargers on the opposite side of the workpiece direct the fluid in an upstream direction or contra to the movement of the workpiece such as a printed circuit board. With those spargers directed upstream, a deflector is desirably provided so that any workpieces such as printed circuit boards which cock along the path of motion will be deflected and not cause jamming. The method of the invention is directed to positioning a plurality of spargers in staggered relationship on opposite sides of workpieces, and further orienting the spargers on the opposite sides of the workpiece to discharge their fluids in the opposite direction.

9 Claims, 6 Drawing Figures

PLATING SPARGER AND METHOD

FIELD OF INVENTION

The present invention is directed to a plating sparger and method, and more particularly that type found useful in copper plating stations of the type where workpieces, such as printed circuit boards, are passed continuously from end to end in a vertical orientation.

RELATED APPLICATIONS

The present invention discloses an apparatus and method useful in the environment of the plating station shown and described in copending patent application Ser. No. 192,424, filed Sept. 29, 1980, entitled "Plating Station and Method".

THE PRIOR ART

Heretofore spargers for use in plating, to stimulate activity of the electrolyte, have normally been vertical pipes with a plurality of drilled holes usually oriented in the direction of the workpiece. The fluid flow is thus agitated to promote surface plating as well as the anode transfer to the cathode workpiece. With such systems plating densities of as much as 100 amperes per square foot can be achieved. If this current density is increased, it can result in "burning" of the workpiece such as a printed circuit board which manifests itself in rough plating and rejects. It, therefore, becomes desirable to be able to increase plating densities of 25 to 50%, and yet at the same time minimize or eliminate the tendency of burning the workpiece such as a printed circuit board.

SUMMARY

The present invention is directed to a sparger in which there are a plurality of nozzles extending from a vertical sparger pipe, and alternating the vertical sparger pipes or sparger tubes have the nozzles at midstations between the adjacent sparger nozzles; with the entire sparger being directed to discharge the fluid to impinge upon the workpiece such as a printed circuit board at an acute angle preferably less than 90°. The resulting pattern on the workpiece is a plurality of footprints, all overlapping a minimum amount on the target area. A further aspect of the invention is directed to having the spargers on one side of the workpiece direct fluid in a downstream direction, whereas the spargers on the opposite side of the workpiece direct the fluid in an upstream direction or contra to the movement of the workpiece such as a printed circuit board. With those spargers directed upstream, a deflector is desirably provided so that any workpieces such as printed circuit boards which cock along the path of motion will be deflected and not cause jamming. The method of the invention is directed to positioning a plurality of spargers in staggered relationship on opposite sides of workpieces, and further orienting the spargers on the opposite sides of the workpiece to discharge their fluids in the opposite direction.

It is a principal object of the present invention to provide a sparger system and method for plating station which will permit increases in current density from 25 to 50%, while minimizing if not eliminating burning of workpieces such as printed circuit boards.

Yet another object of the present invention is to provide the subject spargers with a deflector to avoid jamming when workpieces such as printed circuit boards become disoriented from their normal pass through the plating station in a vertical plane.

Still another object of the present invention is to provide an improved sparger and method for known plating stations which can be economically and readily assembled for retrofit in the unit to upgrade its productivity.

ILLUSTRATIVE DRAWINGS

Further objects and advantages of the present invention will become apparent as the following description of an illustrative embodiment proceeds, taken in conjunction with the accompanying drawings, in which.

DESCRIPTION OF PREFERRED EMBODIMENT

Figures 1, 5:
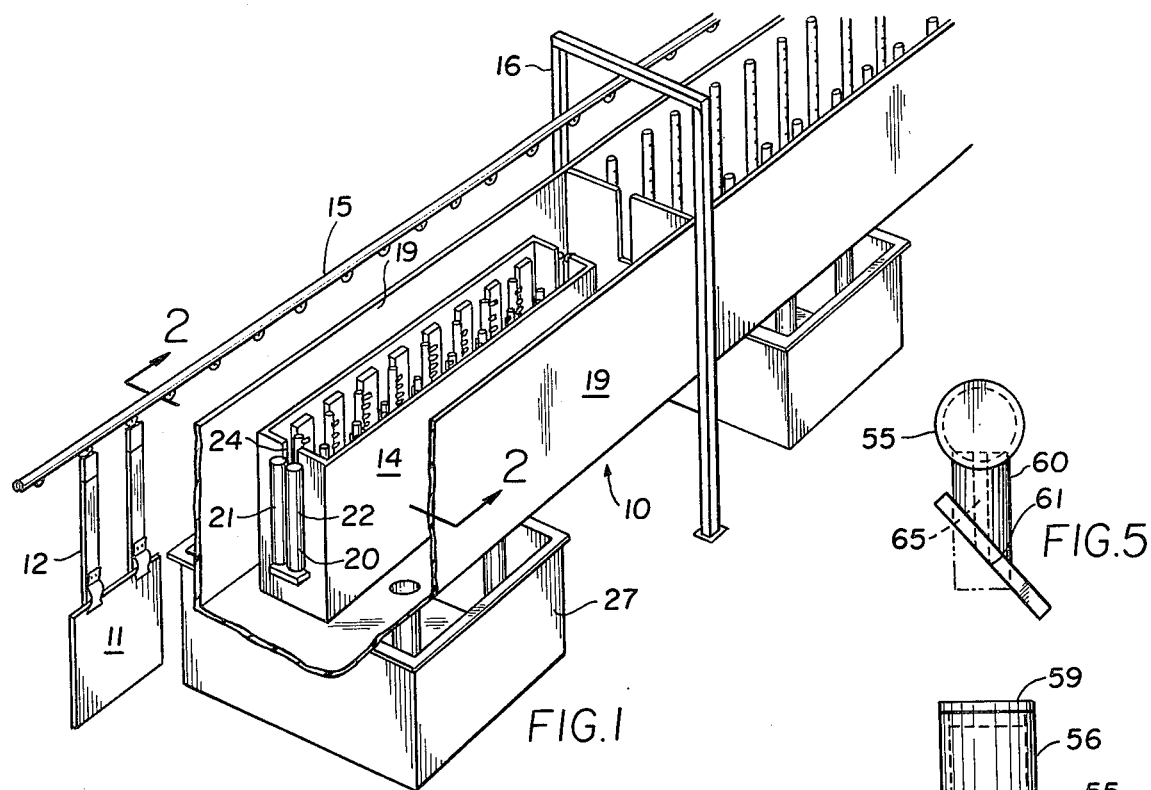
FIG. 1 is a partially diagrammatic broken sectional view of a plating station showing the environment in which the subject sparger is employed.
FIG. 5 is a top elevation in enlarged scale of the sparger and nozzle utilizing a deflector board.
Figures 2, 6:
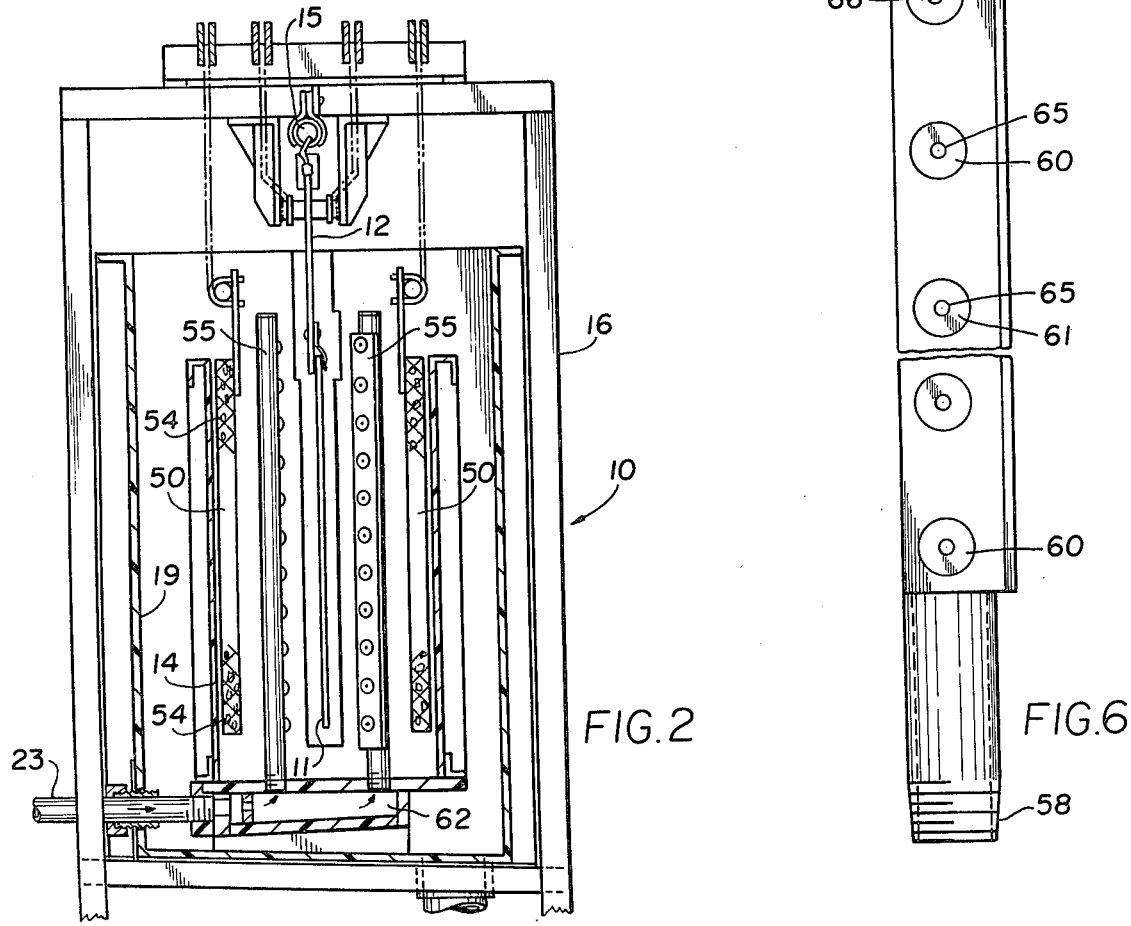
FIG. 2 is a transverse sectional view of FIG. 1 taken on Section 2—2 of FIG. 1.
FIG. 6 is a front elevation of the deflector board and sparger pipe shown in FIG. 5.

The subject invention finds particular utility in a plating station such as disclosed in copending patent application Ser. No. 192,424 filed Sept. 29, 1980. Common reference numerals with that application are employed where pertinent in FIGS. 1 and 2 in particular. There it will be seen that a copper plating station 10 is employed to receive a conveyorized workpiece (such as a printed circuit board) 11 which is secured by means of a workpiece hanger 12 and transferred through the inner plating tank 14 by means of continuous conveyor 15. A frame 16 supports the outer tank 19 as well as the inner plating tank 14. At the entrance end of the inner plating tank 14 a roller seal assembly 20 is positioned. The roller seal assembly 20 includes opposed vertically oriented rollers 21, 22 to close the entry slot 24 in the end of the inner plating tank 14. As shown in FIG. 2, a plating solution line 23 supplies plating solution to the manifold assembly 62 and thereafter into the spargers 55.

The spargers 55 are positioned vertically and on opposite sides of the workpiece 11 is it passes through the plating inner tank 14. In addition, a plurality of anode baskets 50 are suspended within the plating tank 14, and normally contain copper chips 54 normally metal chips of the metal being plated.

Figure 4:
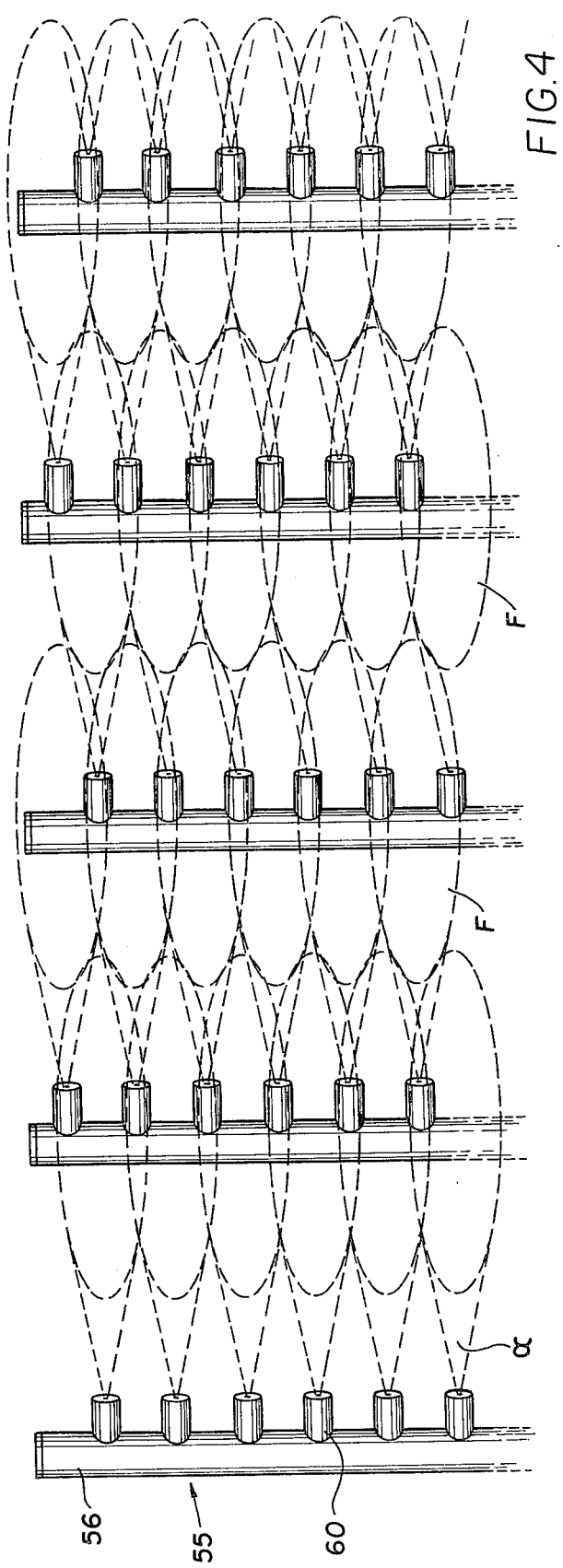
FIG. 4 is a front elevation partially diagrammatic, and showing in phantom lines the footprint of the discharge from each of the sparger nozzles, illustrating the overlapping relationship between the patterns of adjacent sparger pipes and nozzles.

Before noting the details of the sparger and method of the subject application, it should be borne in mind that the purpose of the nozzle 60 on a sparger 55 is to provide uniform agitation on the cathode, or workpiece 11 such as a printed circuit board. A free jet, as it is pumped within a fluid of the same electrolyte as the jet, will develop a cone of agitation (see FIG. 4). This cone will usually develop at an angle called alpha, which is approximately 11°. The cone extends a distance of approximately 100 nozzle diameters from its apex or discharge from the nozzle. During the traversing of the distance of 100 nozzle diameters, the agitation within the cone is quite uniform. Beyond the 100 nozzle diameter distance, the agitation is progressively degraded. It becomes important, therefore, to develop footprints F of the discharge of the nozzles of the sparger essentially as shown in FIG. 4 in which the discharge from the nozzles will not only conform to the footprint F, but entrain adjacent fluid to do the same. The ideal spacing of the nozzles 60 on the sparger 55 is such that the cones will overlap each other by approximately 10 to 20% on the workpiece 11 such as a printed circuit board. Further as noted in FIG. 4, the adjacent sparger pipes 56 and their associated nozzles 60 are provided on off-center spacings in alternating spargers.

Figure 3:
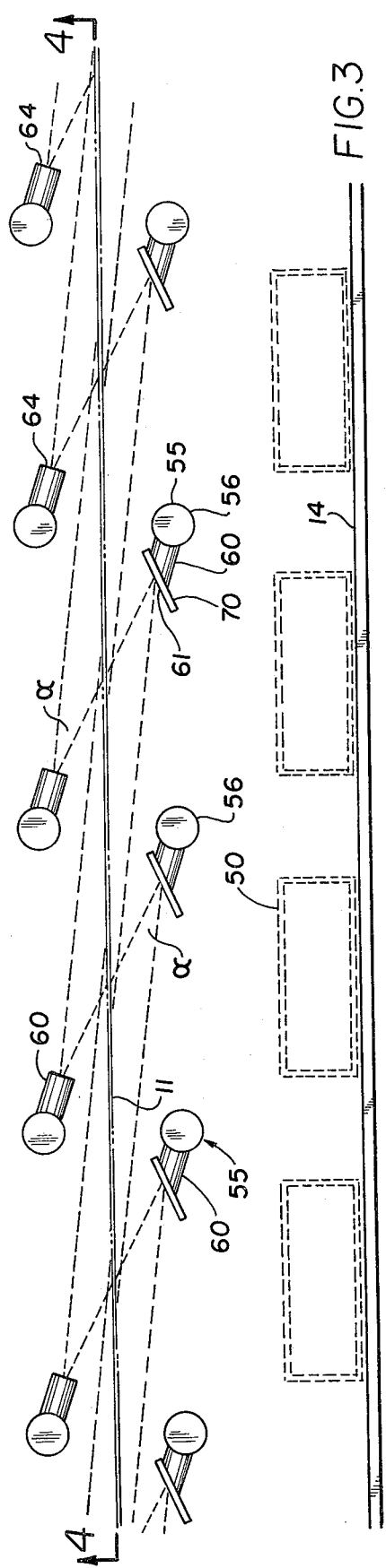
FIG. 3 is a top view partially diagrammatic showing a flat workpiece at the center portion passing from left to right, and diagrammatically illustrating the position of the sparger tubes and nozzles looking down into the unit.

A further aspect of the invention is directed to eliminating a very violent fluid movement through the inner plating cell 14 which will result when the nozzles are all pointed in one direction. Essentially there is a pile-up and high level of fluid at the exit end, or at the entrance end depending upon which direction the spargers are oriented. Thus, as shown in FIG. 3, the spargers and their associated nozzles are reversed so that on one side of the workpiece or printed circuit board all of the nozzles point in the direction of movement of the cathode or workpiece 11, whereas on the other side of the nozzles all point away from the direction of movement of the printed circuit board 11. This, as can be appreciated from the top view of FIG. 3, results in a circulatory motion of the fluid at a uniform level throughout the inner plating cell 14, rather than concentrating the movement of the fluid to one end.

As the nozzles are positioned upstream or opposite the direction of travel of the printed circuit board 11, it will be appreciated that if the printed circuit boards 11 cock as distinguished from tilt along a vertical axis, the leading edge of a printed circuit board could engage a nozzle 60 and jam the entire unit. To this end those nozzles 60 and sparger pipes 55 positioned opposite the flow of the fluid are provided with a deflector board 70, essentially as shown in part in FIG. 3, but more specifically as shown in FIGS. 5 and 6.

Shown in front elevation in FIG. 6 is a sparger 55 which includes a sparger pipe 56 having a base thread 58 at one end and a cap 59 at the other end. The base thread is threaded into the upper portion of the manifold assembly 62 as shown in the lower portion of FIG. 2.

Nozzles 60 are provided on uniform spacing up and down the sparger pipe 56. Each nozzle on one side of the printed circuit board has a bevelled end 61 to which the board deflector 70 is secured. The nozzles on the other side of the unit are provided with flat ends 64. This relationship is particularly shown in FIG. 3. Each of the nozzle orifices 65 is in open communication from either the bevelled end 61 of the nozzle or the flat end 64 of the nozzle with the sparger pipe 56. Normally a modest chamfer is provided (not shown) at the end of the nozzle orifice 65, irrespective of whether that end is a bevelled end 61 or a flat end 64.

As shown in FIG. 4, alternate spargers 55 are positioned a half a center distance apart in their vertical orientation to provide for the overlapping pattern of the footprints F. The nozzle orifices are normally directed to impinge upon the printed circuit board or workpiece 11 at an angle between 10° and 90°, which means that the angle alpha is split to define the footprint F. The board deflectors 70 are positioned on the bevelled end 61 of one side of the spargers 55, and the bevelled end is bevelled approximately 40° to 45° from the axis of the orifice 65.

The sparger pipes 56 are normally of a length sufficient to accommodate enough nozzles 60 to present the total pattern of footprints F as shown in FIG. 4 throughout a 24 inch vertical range.

In operation the flow rate from each sparger 55 approximates 0.5 to 1.5 gallons per minute. Nozzle velocities may vary but are normally predetermined to provide the flow rates identified. Also the positioning of the nozzle 60 is such that the footprint F should be approximately averaged over 100 nozzle diameters from the orifice 65.

In a typical useful embodiment the sparger 55 is provided with seventeen nozzles on typical one and three-eighths inch spacing on a one-half inch inside diameter sparger pipe 56. The orifice diameter is 0.125 inches, and has a one thirty-second inch forty-five degree chamfer. A typical length of a nozzle 65 is one and three thirty-seconds inches. The vertical sparger assembly 55 is positioned with the sparger tubes 56 on nominal six inch centers. With these dimensions the calculated length of the footprints is approximately six and one-half inches long, with a minor axis of approximately one and three-quarters inches.

Although particular embodiments of the invention have been shown and described in full here, there is no intention to thereby limit the invention to the details of such embodiments. On the contrary, the intention is to cover all modifications, alternatives, embodiments, usages and equivalents of a plating sparger as fall within the spirit and scope of the invention, specification and the appended claims.

I claim:
1. A sparger assembly for use in a plating chamber filled with an electrolyte comprising, in combination,
   a plurality of vertical sparger pipes,
   a plurality of nozzles positioned extending diametrically from each of said pipes,
   said pipes being oriented within the plating chamber with the nozzles directed at an angle with the cathode,
   alternating sparger pipes and nozzles being spaced with axes of flow intermediate the axis of flow of each adjacent sparger pipe, whereby a plurality of footprint elliptical-type patterns are directed against a workpiece passing by each sparger nozzle.

2. In the sparger of claim 1 above,
   the sparger pipes and nozzles on one side of the cathode being oriented to direct a flow of fluid in the direction of movement of the cathode,
   and the sparger pipes and nozzles on the opposite side of the cathode being directed opposite the direction of motion of the cathode.

3. In the sparger of claim 2 above,
   a deflector board positioned vertically along an adjacent each of the nozzles of the sparger whose nozzles are directed opposite the movement of the cathode, whereby disoriented and misaligned cathode workpieces such as printed circuit boards will be deflected back into vertical alignment passing through the plating station.

4. In the sparger of claim 1 above, the angle of the nozzle axes and cathode being in the range of 10° to 90°.

5. In the aparger of claim 1 above,
wherein the footprint patterns overlap in the range of 10° to 20° of the footprint.

6. A method for plating vertically oriented workpieces which are flat comprising the steps of:
orienting such workpieces for passing in a vertical plane for horizontal transport through an electrolyte capable of plating onto the workpiece,
providing a cathode connection to said workpieces,
providing an anode within the electrolyte for transferring metal by electro-deposition to the workpiece,
positioning a plurality of vertically oriented spargers having spaced nozzles on each side of the workpiece as it passes through the chamber,
orienting one set of spargers on one side of the workpiece whereby their nozzles are directed to impinge upon the workpiece in the direction of motion of the workpiece, and
orienting the sparger tubes on the opposite side of the workpiece to direct the flow of the nozzles to impinge their discharge at an acute angle to the workpiece in the direction opposite the travel of the workpiece.

7. In the method of claim 6 above,
orienting the spargers on both sides of the workpiece so that alternating adjacent spargers have nozzles oriented at a mid-position on the adjacent sparger tube and nozzle,
whereby overlapping footprints of the fluid discharged from the adjacent nozzles are apparent in projection upon the workpiece.

8. In the method of claim 6 above,
angling the sparger nozzles in the range of 10° to 90° with the cathode.

9. In the method of claim 7 above,
conforming the footprints to overlap in the range of 10° to 20° of their projected area on the cathode.

* * * * *